United States Patent
Di Stefano et al.

(10) Patent No.: US 10,408,873 B2
(45) Date of Patent: Sep. 10, 2019

(54) PARTIAL DISCHARGE SIGNAL PROCESSING METHOD AND APPARATUS EMPLOYING NEURAL NETWORK

(71) Applicant: PRYSMIAN S.P.A., Milan (IT)

(72) Inventors: Antonio Di Stefano, Milan (IT); Roberto Candela, Milan (IT); Giuseppe Fiscelli, Milan (IT); Giuseppe Costantino Giaconia, Milan (IT)

(73) Assignee: PRYSMIAN S.p.A., Milan (IT)

( * ) Notice: Subject to any disclaimer, the term of this patent is extended or adjusted under 35 U.S.C. 154(b) by 926 days.

(21) Appl. No.: 14/889,983

(22) PCT Filed: May 10, 2013

(86) PCT No.: PCT/EP2013/059715
§ 371 (c)(1),
(2) Date: Nov. 9, 2015

(87) PCT Pub. No.: WO2014/180508
PCT Pub. Date: Nov. 13, 2014

(65) Prior Publication Data
US 2016/0116520 A1   Apr. 28, 2016

(51) Int. Cl.
*G06F 9/30* (2018.01)
*G06N 3/063* (2006.01)
(Continued)

(52) U.S. Cl.
CPC ......... *G01R 31/02* (2013.01); *G01R 31/1245* (2013.01); *G01R 31/1272* (2013.01);
(Continued)

(58) Field of Classification Search
CPC ... G06N 3/10; G06N 3/08; G06N 3/04; G01R 31/02; G01R 31/1245
(Continued)

(56) References Cited

U.S. PATENT DOCUMENTS 5,419,197 A    5/1995   Ogi et al.
2004/0246000 A1*   12/2004   Kuppuswamy .... G01R 31/1254
                                                                            324/536

FOREIGN PATENT DOCUMENTS

EP    0 572 767     12/1993
JP    02-296161     12/1990
(Continued)

OTHER PUBLICATIONS

Hans-Gerd Kranz: Diagnosis of Partial Discharge Signals using Neural Networks and Minimum Distance Classification, pp. 1016-1024, IEEE Transactions on Electrical Insulation vol. 28 No. 8, Dec. 1993 (Year: 1993).*

(Continued)

*Primary Examiner* — Kuen S Lu
(74) *Attorney, Agent, or Firm* — Finnegan, Henderson, Farabow, Garrett & Dunner, L.L.P.

(57) ABSTRACT

A partial discharge signals processing method includes: setting a first discrimination criterion among the following criteria: discharge signals acquisition, discharge signals noise filtering, and discharge signals classification; providing a plurality of pulse waveforms associated with detected partial discharge waveform signals; defining at least a first reference pulse waveform in accordance with the first criterion; performing a first training of a neural network module based on the at least a first reference pulse waveform to produce a similarity index adapted to selectively assume a first value and a second value representative of a similarity/non similarity of an input pulse waveform with the at least a first reference pulse waveform, respectively; comparing the plurality of pulse waveforms with the at least a first reference pulse waveform by means of the neural network module to obtain first similarity index values; and memorizing/rejecting each compared pulse waveform on the basis (Continued)

of the obtained first similarity index values and on the second discrimination criterion.

19 Claims, 8 Drawing Sheets

(51) Int. Cl.
    *G06F 9/38*     (2018.01)
    *G01R 31/02*     (2006.01)
    *G06N 3/10*     (2006.01)
    *G01R 31/12*     (2006.01)
    *G06N 3/04*     (2006.01)
    *G06N 3/08*     (2006.01)
    *G01R 31/14*     (2006.01)

(52) U.S. Cl.
    CPC .............. *G01R 31/14* (2013.01); *G06N 3/04* (2013.01); *G06N 3/08* (2013.01); *G06N 3/10* (2013.01); *G06N 3/0481* (2013.01); *G06N 3/084* (2013.01)

(58) Field of Classification Search
    USPC .............................................. 706/15; 702/58
    See application file for complete search history.

(56) References Cited

FOREIGN PATENT DOCUMENTS

| | | |
|---|---|---|
| JP | 02-296162 | 12/1990 |
| JP | 08-338856 | 12/1996 |
| WO | WO 2009/150627 | 12/2009 |

OTHER PUBLICATIONS

Oki et al.: Development of Partial Discharge Monitoring Technique Using a Neural Network in a Gas Insulated Substation, pp. 1016-1021, IEEE Tran actions on Power Systems, vol. 12, No. 2, May 1997 (Year: 1997).*

Japanese Patent Application Publication No. JP 02-296162. The relevance of this document is discussed at p. 2 of the specification of the present application.

Japanese Patent Application Publication No. JP 02-296161. The relevance of this document is discussed at p. 2 of the specification of the present application.

Japanese Patent Application Publication No. JP 08-338856. The relevance of this document is discussed at p. 2 of the specification of the present application.

Oki et al.; "Development of Partial Discharge Monitoring Technique Using a Neural Network in a Gas Insulated Substation", IEEE Transactions on Power Systems, vol. 12, No. 2, pp. 1014-1021, (1997).

Kranz; "Diagnosis of Partial Discharge Signals Using Neural Networks and Minimum Distance Classification", IEEE Transactions on Electrical Insulation, vol. 28, No. 6, pp. 1016-1024, (1993).

Nguyen et al.; "FPGA Implementation of Neural Network Classifier for Partial Discharge Time Resolved Data From Magnetic Probe", 2011 The International Conference on Advanced Power System Automation and Protection (APAP), pp. 451-455, (2011).

Oskuoee et al.; "A New Feature Extraction and Pattern Recognition of Partial Discharge in Solid Material by Neural Network". 2012 8$^{th}$ International Conference on Natural Computation (ICNC 2012), pp. 183-187, (2012).

Yamazaki et al.: "Partial Discharge Recognition Using a Neural Nernoric", Proceedings of the 4$^{th}$ International Conference on Properties and Applications of Dielectric Materials, pp. 642-645, (1994).

Pinpart et al.; "Differentiating Between Partial Discharge Sources Using Envelope Comparison of Ultra-High-Frequency Signals", IET Science, Measurement and Technology, vol. 4, No. 5, pp. 256-267, (2010).

International Search Report from the European Patent Office for International Application No. PCT/EP2013/059715, dated Jan. 27, 2014.

Written Opinion of the International Searching Authority from the European Patent Office for International Application No. PCT/EP2013/059715, dated Jan. 27, 2014.

* cited by examiner

PARTIAL DISCHARGE SIGNAL PROCESSING METHOD AND APPARATUS EMPLOYING NEURAL NETWORK

CROSS REFERENCE TO RELATED APPICATION

This application is a national phase application based on PCT/EP2013/059715, filed May 10, 2013, the content of which is incorporated herein by reference.

BACKGROUND

Technical Field

The present invention relates to partial discharge signal processing method and apparatus. Partial discharge processing is particularly used for analysing partial discharges in electrical components and systems, such as: medium or high voltage cables, cable joints, overhead line insulators, medium and high voltage switchboard boxes, high and extra-high voltage cables using GIS (Gas Insulated Switchgear).

Description of the Related Art

The term "partial discharges" is intended to indicate an undesired recombination of electric charges occurring in the dielectric (insulating) material of electric components, in the presence of defects of various types, eventually leading to dielectric destruction. Here, a pulse current is generated in portions of dielectric material and causes an electromagnetic wave to propagate through the power or ground cables of the relevant electric system, and radiating through the various surrounding media (dielectric material, metals, air, etc.).

When performing a partial discharge measurement a large number of pulse signals are acquired and processed. Modern instrumentation allows digitizing pulse signals at a very high sampling frequency, so the entire pulse waveforms can be acquired and processed. An operation performed during the measurement process is the selection of specific pulses according to predetermined discrimination criteria. As an example, possible discrimination criteria are: discharge signals acquisition, discharge signals noise filtering, discharge signals classification.

The discharge signals acquisition involves the selection of only some waveform (having a level higher than a specified threshold) among the detected ones. Discharge signals noise filtering involves the selection of actual partial discharge pulses and rejecting noise. Discharge signals classification involves selecting pulses according to their specific characteristics and grouping the most similar into different classes.

Discharge signals acquisition can be based on frequency filtering and level thresholding, implemented by analog circuits. Discharge signals noise filtering and classification are instead performed by selection methods generally based on waveform feature extraction. These algorithms usually work by extracting a small set of parameters (features) from each pulse waveform, and comparing them against specific thresholds, so trying to estimate if each pulse falls within a specific class. The effectiveness of these algorithms is critically depending on the specific feature set chosen.

Selection method employing neural networks are known. Document JP02-296162 describes a method for separating and detecting external noise and partial discharge signals. According to this method a shielding layer of a cable is cut so obtaining two opposite cut ends. A pulse shaped voltage waveform generated at one of the cutting end is compared to another pulse shaped voltage generated at the other cut end by means of a neural network. Both the two pulse shaped voltage waveforms are inputted at an input layer of the neural network. This comparison allows distinguishing partial discharge signals (for which similar pulses are generated at both cut ends) from noise signals.

Document JP02-296161 discloses a method for detecting partial discharge position by making a neural network learn different waveforms formed by the partial discharge. An electrical unit where the partial discharge is generated is detected based on the result of the learning and the wave of the newly generated partial discharge.

Document JP08-338856 illustrates a method for deciding whether a partial discharge is present or not. The method includes the steps of: teaching a neural network; detecting partial discharge and noise signals from a designated point of a power cable a plurality of times; feeding a detected signal to the neural network and determining an evaluation value; averaging a plurality of evaluation values and comparing with a threshold value.

BRIEF SUMMARY OF THE INVENTION

The technical problem addressed by the invention is that of providing a processing method capable of analysing partial discharge signals on the basis of discrimination criteria (such as, acquisition, noise filtering, pulse classification) so as to be usable on different electrical apparatus in different environments.

The applicant found that a method for processing input signals employing a neural network trained with a reference pulse waveform defined in accordance with a chosen discrimination criterion and configured to produce a similarity index selectively assuming a first value and a second value representative of a similarity/non similarity of an input pulse waveform with the reference pulse waveform, is suitable for detecting harmful partial discharges on different electrical apparatus and in different environments.

According to a first aspect, the present invention relates to a partial discharge signals processing method comprising:

setting a first discrimination criterion among the following: acquisition, noise filtering, classification of partial discharge;

providing a plurality of pulse waveforms associated with detected partial discharge waveform signals;

defining a first reference pulse waveform in accordance with the first criterion;

performing a first training of a neural network module based on said first reference pulse waveform to produce a similarity index selectively assuming a first value and a second value representative of a similarity/non similarity of an input pulse waveform with the first reference pulse waveform, respectively;

comparing said plurality of pulse waveforms with the first reference pulse waveform by means of the neural network module to obtain first similarity index results;

memorizing/rejecting each compared pulse waveform on the basis of the obtained first similarity index results and on the first discrimination criterion.

Advantageously, the processing method further comprises:

setting a second discrimination criterion different from the first criterion;

selecting a second reference pulse waveform in accordance with the second criterion;

performing a second training of said neural network module to produce the similarity index selectively assuming the first value and the second value representative of a similarity/non similarity of a further input pulse waveform with the second reference pulse waveform, respectively;

comparing at least part of said plurality of pulse waveforms with the second reference pulse waveform by means of the neural network module to obtain second similarity index results;

memorizing/rejecting each compared pulse waveform resulting on the basis of the obtained second similarity index results and on the second discrimination criterion.

Advantageously, the neural network module is configured to implement an activation function included in the group comprising: a non-linear function, a step-like function, a Sigmoid function, an identity function, a Tangtoid function, a step function, a signum function, a piecewise linear function.

Preferably, the neural network module comprises:

a plurality of input ports, each input port being configured to receive a digital sample associated with a pulse of said plurality of pulse waveforms;

at least one neurode having associated a plurality of weights, and an output port configured to provide the similarity index and connected to the neurode which is an output neurode.

As "neurode" is intended, a processing element of a neural network, an artificial neuron.

Advantageously, said neural network module has the structure of a Multi Layer Perceptron and comprises a hidden layer provided with a plurality of hidden neurodes having inputs connected to the plurality of input ports.

As "Multi Layer Perceptron" is intended a feedforward artificial neural network comprising multiple layers of neurodes in a directed graph, with each layer fully connected to the next one. Particularly, if a hidden layer is employed said neural network module includes a single hidden layer having outputs connected to the output neurode.

Preferably, the first discrimination criterion is one of the following: discharge signals noise filtering, discharge signals classification.

Preferably, the neural network module includes a single hidden layer and it is a software module.

Alternatively, the neural network module has the structure of a perceptron and includes a single neurode connected between the input and the output port. As "perceptron" is intended a neural network comprising a single neurode. Particularly, said perceptron is used to implement said discharge signals acquisition criterion. Advantageously, said neural network module is a hardware module.

Preferably, when the second training is performed, said first and second discrimination criteria are the discharge signals noise filtering and the discharge signals classification.

Advantageously, performing the first training includes: calculating a plurality of weights values of said plurality of weights by supplying the neural network module with counter-examples for which said second value representative of a non-similarity result is requested.

Preferably, comparing by means of the neural network module includes:

defining a plurality of group of samples, each group of samples representing a pulse waveform of said plurality of pulse waveforms;

supplying each group of samples to the plurality of input ports obtaining a similarity index value for each group of samples.

Advantageously, before supplying each group of samples to the plurality of input ports, the method further comprises:

performing a waveform normalization in which each sample of the group of samples is divided by a waveform absolute maximum value;

performing a peak alignment so as each peak sample of each group of samples is supplied to a selected input port of the plurality of input ports.

Particularly, defining the first reference pulse waveform includes: synthetizing the first reference pulse waveform in accordance with the first criterion.

Alternatively, defining the first reference pulse waveform includes: selecting the first reference pulse waveform from said plurality of pulse waveforms.

Advantageously, the processing further includes:

detecting said partial discharge waveform signals associated with partial discharges of an electric component;

detecting a synchronization electromagnetic signal generated by an alternate current electrical voltage associated with the operation of an electrical object;

synchronizing said partial discharge waveform signals to said synchronization electromagnetic signal.

According to a second aspect, the present invention relates to a partial discharge signals processing system comprising:

a detecting device structured to detect a plurality of pulse waveforms associated with detected partial discharge waveform signals;

a processing module connected to the detecting device and comprising:

a neural network module comprising:

an input module for receiving an input pulse waveform of said plurality of pulse waveforms;

a comparison module connected to the input module and structured to compare a reference pulse waveform with the input pulse waveform; and an output port connected to the comparison module and structured to provide a similarity index (SI) selectively assuming a first value or a second value of a similarity/non similarity of the input pulse waveform with the reference pulse waveform, respectively, representative of the nature of the detected pulse waveform, wherein said processing module includes a setting module structured to set a discrimination criterion selected among the following: discharge signals acquisition, discharge signals noise filtering, discharge signals classification; and a reference selection module connected to the setting module and structured to select the reference pulse waveform in accordance with the selected discrimination criterion.

BRIEF DESCRIPTION OF THE DRAWINGS

Further characteristics and advantages will be more apparent from the following description of a preferred embodiment and of its alternatives given as a way of example with reference to the enclosed drawings in which:

FIG. 5,a) shows an example of a the trend of a pulse waveform to be processed and FIG. 5,b) shows a first example of a neural network module employable by said partial discharge acquisition system having the structure of a Multi Layer Perceptron;

FIG. 7,a) shows again said example of a the trend of a pulse waveform to be processed and FIG. 7,b) illustrates a second example of the network module implemented as a perceptron;

DETAILED DESCRIPTION

Figure 1:
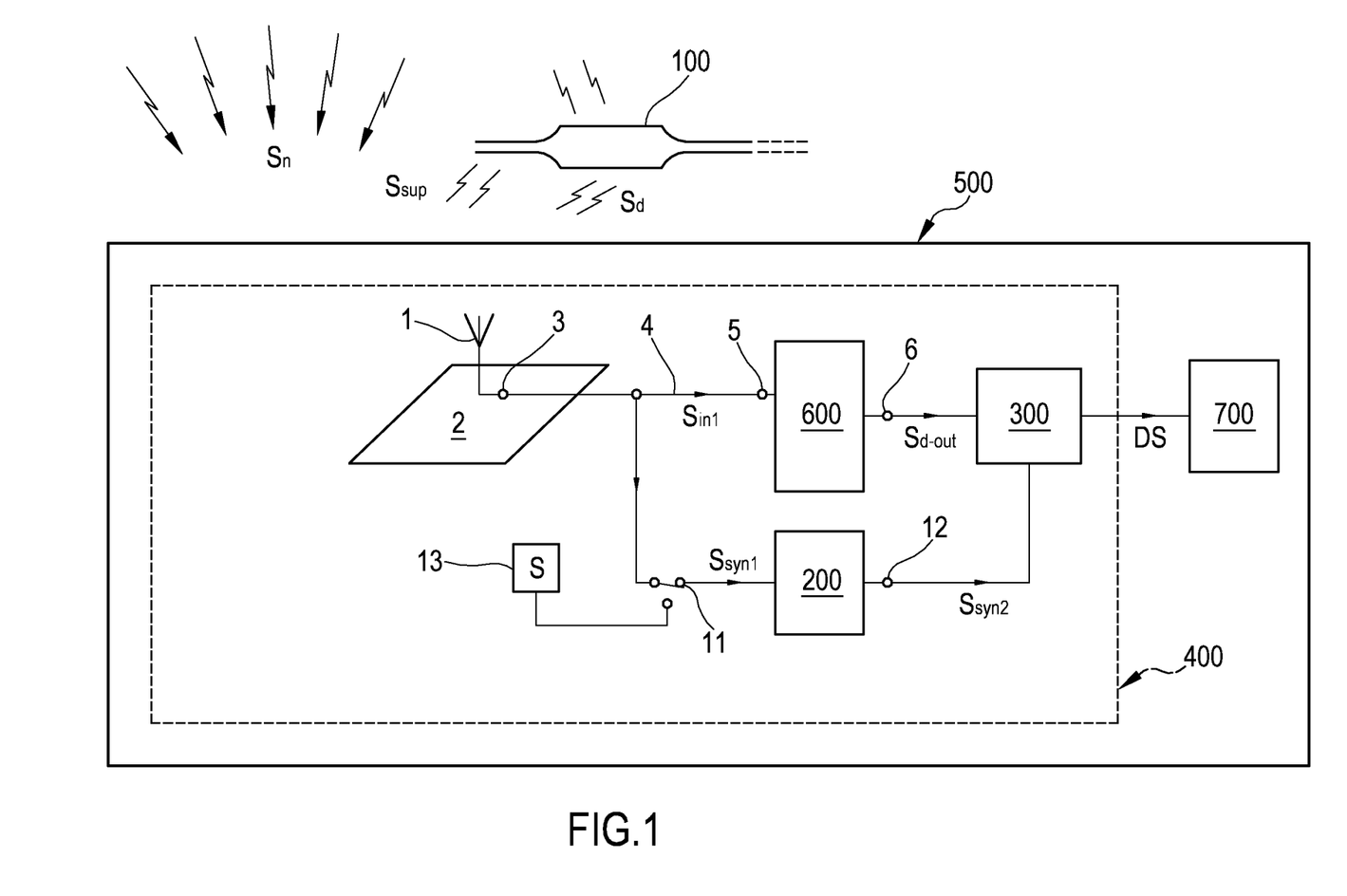
FIG. 1 shows an example of an electrical object, a partial discharge acquisition system comprising a partial discharge detection apparatus provided with an acquisition and analysis device and a selection processing module.

FIG. 1 shows an electrical object 100 and a partial discharge acquisition system 500 comprising a partial discharge detection apparatus 400, an acquisition and analysis device 300 and a selection processing module 700 which is particularly, external to the partial discharge detection apparatus 400. The acquisition and analysis device 300 can be included in a housing also containing the partial discharge detection apparatus 400 (as in FIG. 1) or can be provided in a separated housing, e. g. together with the selection processing module 700. As an example, the partial discharge detection apparatus 400 is portable and includes one or more batteries.

The electrical object 100 can be any kind of component, device, apparatus or system which can produce partial discharge electromagnetic pulses and is, as an example: a medium or high voltage cable, a cable joint, an overhead line insulator, a medium or high voltage switchboard box, a high and extra-high voltage cable using GIS (Gas Insulated Switchgear), an electric motor or generator or a medium or high voltage transformer.

The partial discharge acquisition system 500 is an electronic apparatus employable to detect, measure and/or process and analyse partial discharges generated by electrical sources as the electrical object 100. Particularly, the partial discharge acquisition system 500 can be portable and is included in a case not shown in the figures.

The partial discharge acquisition system 500 is preferably configured to be placed in proximity of the electrical object 100 to detect discharge electromagnetic signals $S_d$ corresponding to partial discharge pulses emitted by the electrical object 100. It is also observed that electromagnetic noise signals $S_n$ which could disturb the detection of the electromagnetic signals corresponding to the partial discharge pulses can be present in the area in which the partial discharge acquisition system 500 is employed.

The discharge signals $S_d$ to be detected can be electromagnetic wave pulses having frequencies included in the range 0.1 MHz to 100 MHz. The noise signals $S_n$ have typically frequencies included in the same range 0.1 MHz to 100 MHz.

The partial discharge detection apparatus 400 (hereinafter also called "detection apparatus", for the sake of conciseness) comprises a sensor 1 which is adapted to detect the discharge signals $S_d$, but it can also receive unwished electromagnetic noise signals $S_n$. The sensor 1 can be a contact sensor or a contactless sensor. A contact sensor is put in contact or in proximity with the electrical object 100 while a contactless or wireless sensor is adapted to perform a remote detection, i.e. without wires or cables connecting the source and the sensor device and without physical contact. As an example, the remote detection can be performed at a distance from the signal source of from 1 cm to 10 m. Examples of contact sensors are: Rogowsky sensor and coupler transformer type magnetic sensor. Examples of contactless sensors are: magnetic field proximity sensor, acoustic sensor and piezoelectric sensor.

In accordance with the described embodiment, the sensor 1 is an antenna which can be mounted, as an example, on a support structure 2. As a further example, the antenna 1 can be one of the following antennas: small patch antenna, loop antenna, dipole and ultra wideband antenna. Preferably, the antenna 1 is spherical shaped and includes a hollow sphere in electrically conducting material such as, for example, metal or polymer material. The spherical shaped antenna 1 shows, as an example, a diameter comprised between 3 and 30 cm, preferably comprised between 5 and 20 cm. Particularly, the antenna 1 can be analogous to that described in patent application WO-A-2009-150627.

The antenna 1 is configured to receive the discharge signals $S_d$ and the unwanted noise signal $S_n$ and convert them into a received electrical signal $S_{in1}$ (e.g. an electrical current) available on a first output terminal 3. The partial discharge detection apparatus 400 of FIG. 1 further comprises a discharge processing module 600 and a synchronization processing module 200. The discharge processing module 600 shows a first input terminal 5 connected, by means of a first conductive line 4, to the first output terminal 3 of the antenna 1 and is structured to perform a band-pass filtering and/or an amplification of the received electrical signal $S_{in1}$ so providing an output discharge signal $S_{d-out}$ at second output terminal 6.

Figure 2:
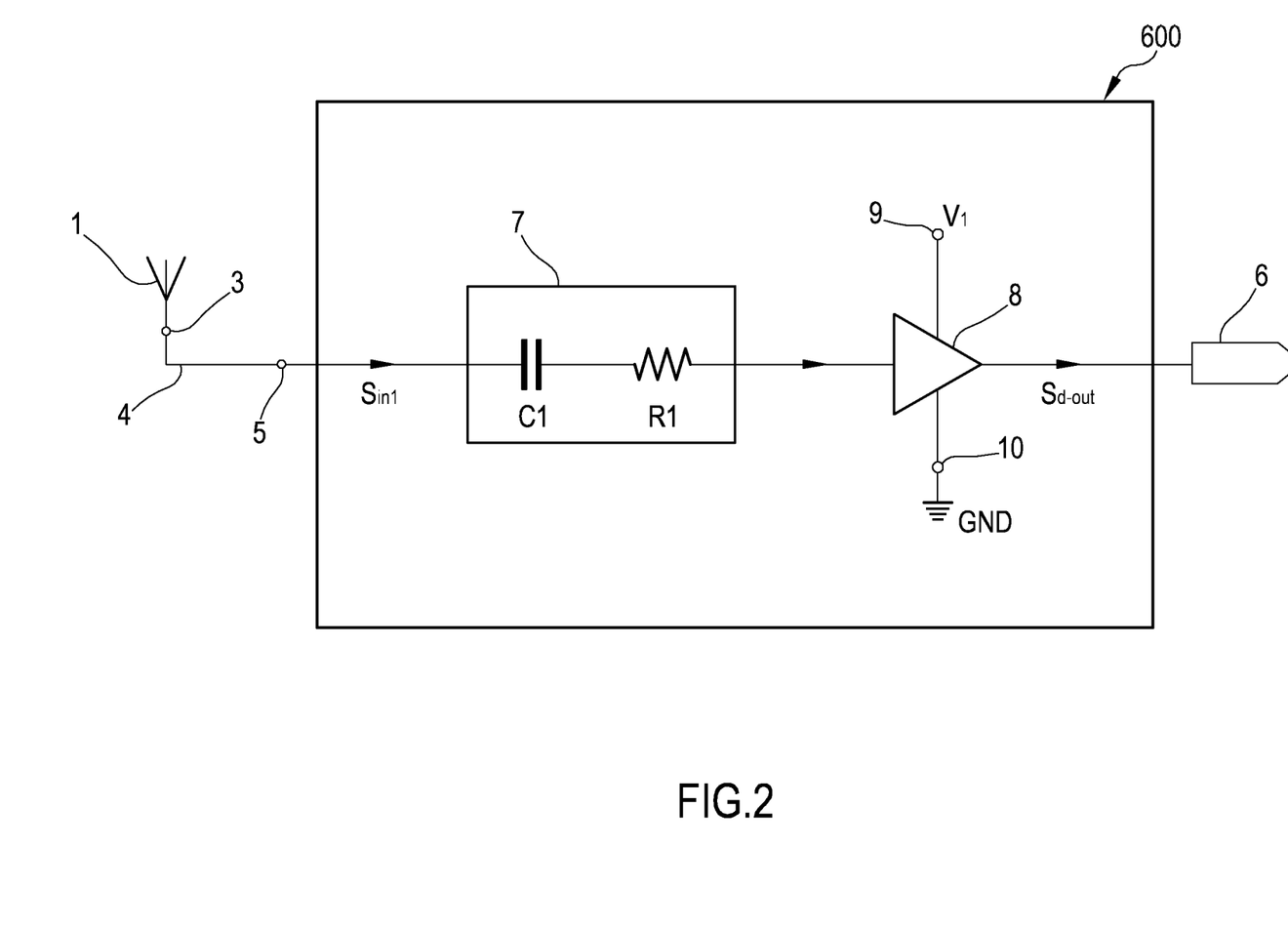
FIG. 2 shows an example of discharge processing module employable by said partial discharge acquisition system which comprises a high pass filtering module and an amplifier.

FIG. 2 refers to an example of the discharge processing module 600 comprising a high pass filtering module 7 having a respective input connected to the first input terminal 5 and structured to remove low-frequency noise, such as signals having frequencies lower than 0.1 MHz. As an example, the high pass filtering module 7 can include a first capacitor C1 connected in series with a first resistor R1. An output of the high pass filtering module 7 is connected to a first amplifier 8 having a respective output terminal connected to the second output terminal 6. As an example, another filter, such as band pass, band stop or low pass filter (not shown) can be connected to the output of the high pass filtering module 7 to obtain an overall band pass frequency response with desired characteristics.

The first amplifier 8 is provided with a first supply terminal 9 for a supply voltage $V_1$ and a second supply terminal 10 connected to a ground terminal GND. The first amplifier 8 shows, as an example, a bandwidth at least including the bandwidth of the first antenna 1 such as an example, a bandwidth ranging from 0.1 MHz to 100 MHz.

The synchronization processing module 200 included into the detection apparatus 400 is configured to receive, filter and amplify a first synchronization electrical signal $S_{syn1}$ at a second input terminal 11 and provide on a third output terminal 12 a second synchronization electrical signal $S_{syn2}$. The first synchronization electrical signal $S_{syn1}$ represents the trend of the AC (Alternate Current) electrical voltage supplied to the electrical object 100 under test. Typically, the AC electrical voltage has a frequency comprised between 1 Hz to about 1000 Hz. The first synchronization electrical signal $S_{syn1}$ can be obtained, for example, by a wireless and contactless detection, performed by the antenna 1, of a supply electromagnetic signal $S_{sup}$ generated by the electrical voltage passing through the electrical object 100.

The second input terminal 11 is connected to the first conductive line 4 to receive the received electrical signal $S_{in1}$, also including the first synchronization electrical signal $S_{syn1}$. In the present instance the antenna 1 is designed to operate as a capacitive coupling sensor to detect the first synchronization electrical signal $S_{syn1}$ from the supply electromagnetic signal $S_{sup}$. Also, the antenna 1 is designed to offer a suitable capacitive coupling with the AC (Alternate Current) electrical voltage feeding the electrical object 100 showing, as an example, a suitable coupling surface.

Alternatively, the first synchronization electrical signal $S_{syn1}$ can be detected by a synchronization sensor 13 connectable to the second input terminal 11, such as a further antenna for a wireless and contactless detection, or another type of sensor to be put into contact with the electrical object 100 or with another electrical component operating at the same electrical voltage supplied to the electrical object 100.

Figure 3:
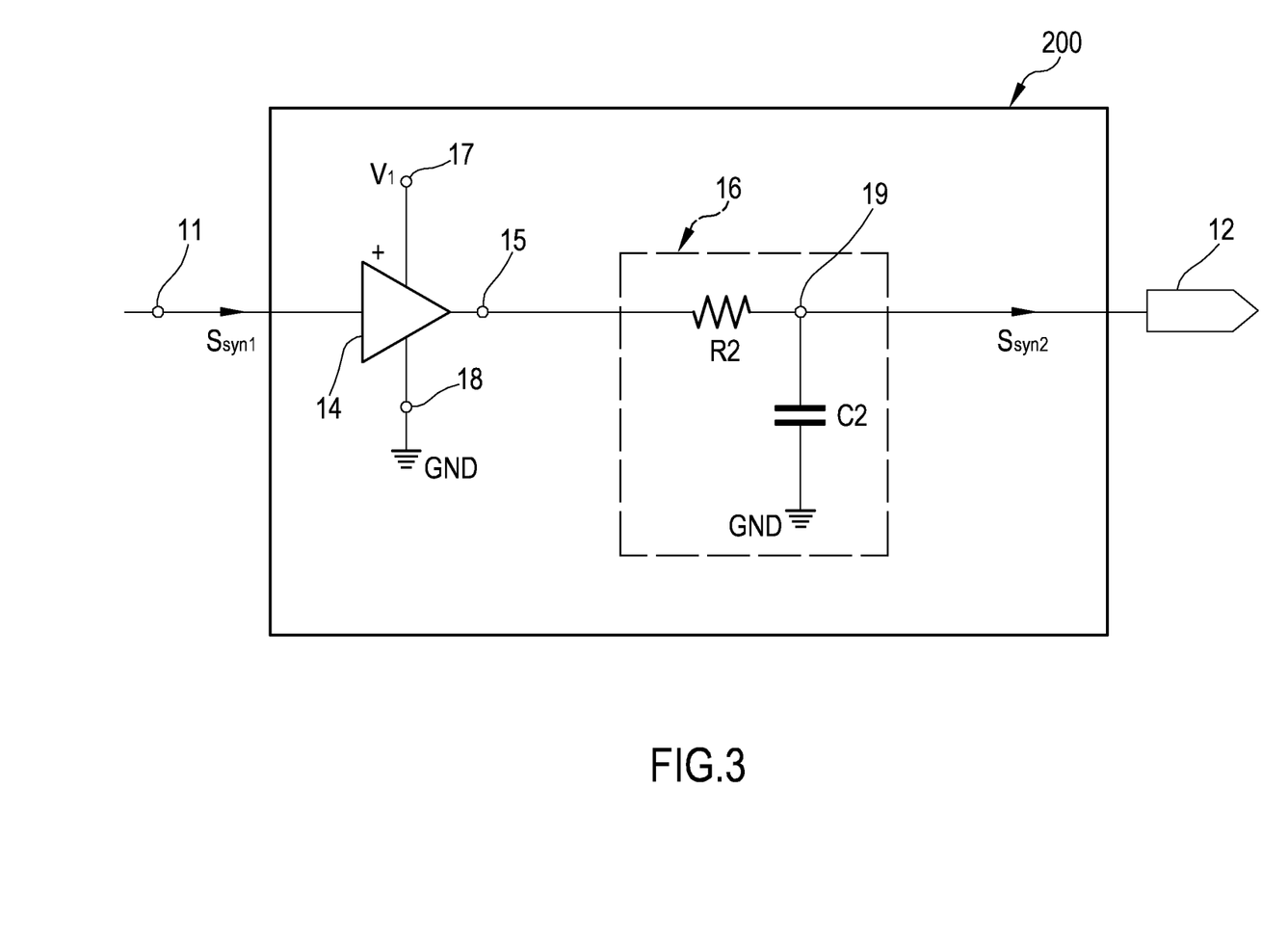
FIG. 3 shows an example of synchronization processing module employable by said partial discharge acquisition system.

FIG. 3 shows the synchronization processing module 200 comprising an amplifier module 14, such as a high gain buffer amplifier, having an input connected the second input terminal 11 and a fourth output terminal 15 connected to a low pass filter module 16. The high gain buffer amplifier 14 is also provided with a third supply terminal 17 for the supply voltage V1 and a fourth supply terminal 18 connected to the ground terminal GND.

As an example, the high gain buffer amplifier 14 is a voltage amplifier and has a gain greater than 100. Moreover, the high gain buffer amplifier 14 shows an input-output impedance greater than 1 MOhm and can have an overall bandwidth lower than 1 kHz. The low pass filter module 16 includes, in this example, a second resistor R2, connected between the fourth output terminal 15 and a node 19, and a second capacitor C2 connected between the node 19 and the ground terminal GND. The node 19 is connected to the third output terminal 12.

The acquisition and analysis device 300 and/or the selection processing module 700 is/are configured to perform a discrimination process of the output discharge signal $S_{d-out}$ according to at least one of the following discrimination criteria: discharge signals acquisition, discharge signals noise filtering and discharge signals classification. Particular, each discrimination criterion can be implemented by a comparison with a reference pulse waveform suitably chosen, i.e. showing an amplitude of the pulse which has to be over than a threshold level. The discharge signal acquisition process allows selecting and storing pulse waveforms which meet a particular criterion based, as an example, on predetermined characteristics which the pulse has to show to be acquired. In particular, this discrimination criterion is implemented by a comparison of the output discharge signal $S_{d-out}$ with a reference pulse waveform. The pulse waveforms showing a certain degree of similarity with the reference waveform are acquired (a trigger event is generated), else they are rejected.

The discharge signals noise filtering process allows identifying among the output discharge signal $S_{d-out}$, or in signals derived from the output discharge signal $S_{d-out}$, pulse waveforms corresponding to actual partial discharge phenomena and rejecting noise waveforms. According to an example, this discharge signals noise filtering process can be additional to the noise filtering performed in the discharge processing module 600. Particular, this discrimination criterion is implemented by a comparison with a reference pulse waveform showing a shape typical of the partial discharge phenomena and different from noise signals.

The discharge signals classification process allows grouping pulse waveforms, selected from the output discharge signal $S_{d-out}$, or signals derived from the output discharge signal $S_{d-out}$, into a plurality of different classes corresponding to different partial discharge phenomena. As an example, a first partial discharge pulse class refers to partial discharge signals due to defect in the internal dielectric of the electrical object while a second partial discharge pulse class refer to defect on the surface, and another to corona discharge. Particular, this discrimination criterion is implemented by a comparison with a reference pulse waveform showing a shape typical of the predetermined class.

Each of the above mentioned discrimination criteria can be implemented by means of a neural network module included in the acquisition and analysis device 300 and/or in the selection processing module 700. The neural network module can be configured to implement a discrimination process according to one single criterion. In this case, to implement a discrimination process according to two or three of the above listed discrimination criteria two or three separated neural network modules are employed, respectively. Alternatively, a single neural network module can be provided to selectively implement more than one discrimination criteria.

The discharge signals acquisition process can be performed by the acquisition and analysis device 300 while the discharge signals noise filtering process and the discharge signals classification process can be performed by the selection processing module 700.

With reference to this first example, the acquisition and analysis device 300 of FIG. 1 is configured to receive the output discharge signal $S_{d-out}$ and perform processing steps to produce a plurality digital samples DS representing this output discharge signal $S_{d-out}$. Particularly, the acquisition and analysis device 300 is configured to represent a pulse waveform of the output discharge signal $S_{d-out}$ with a number of samples comprised between 32 and 256. As an example, the acquisition and analysis device 300 is structured to perform analog-to-digital conversion, selection, acquisition and synchronization processing steps.

Figure 4:
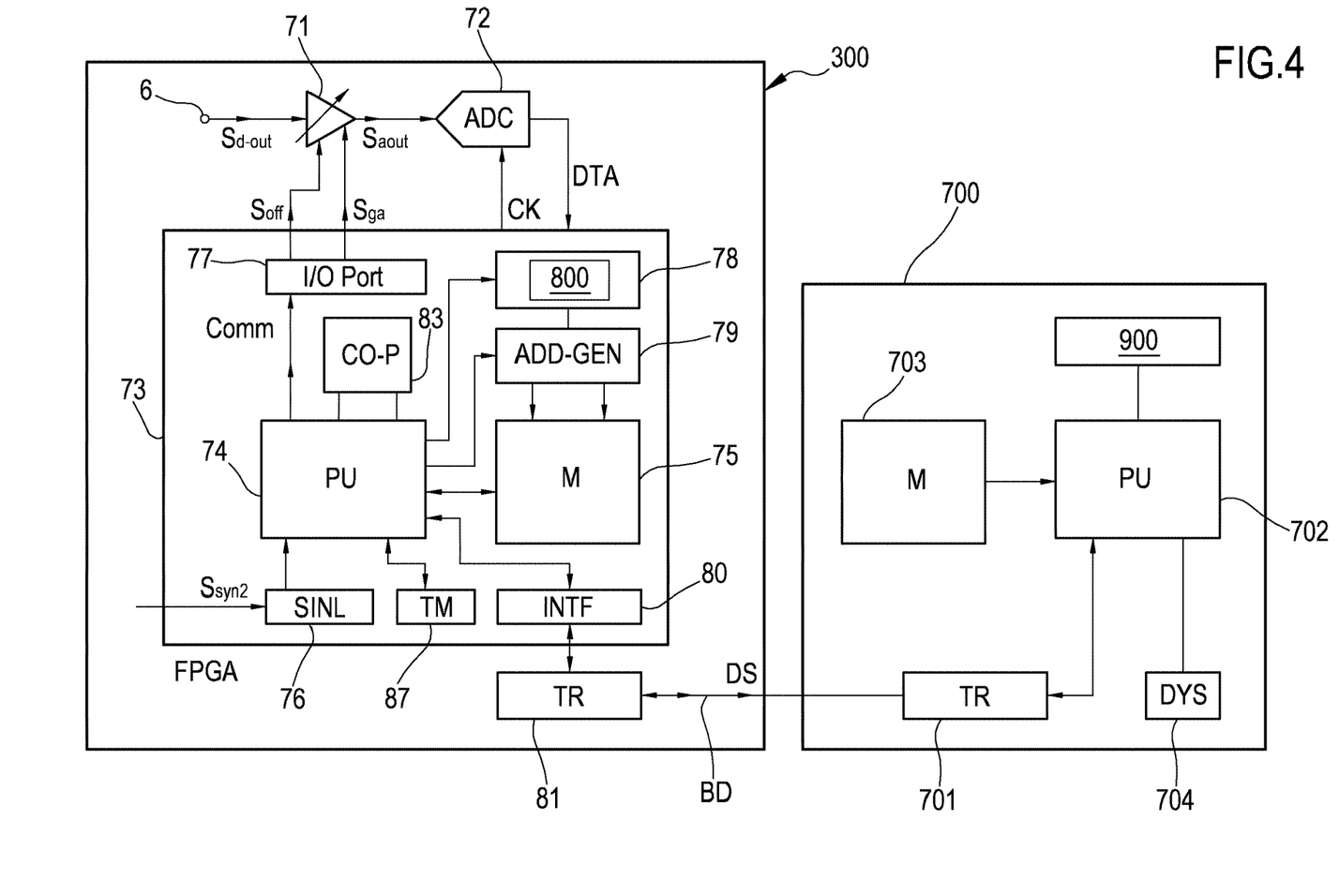
FIG. 4 schematically shows an embodiment of the acquisition and analysis device.

FIG. 4 schematically shows an example of the acquisition and analysis device 300 comprising an optional wide band programmable amplifier 71 having an input connected to the second output terminal 6 of the discharge processing module 600 and a respective output connected to an analog-to-digital converter 72 (ADC). The acquisition and analysis device 300 also includes a control module 73 such as a Field Programmable Gate Array (FPGA) which is structured to control the wide band programmable amplifier 71 and receive data from the analog-to-digital converter 72. The wide band programmable amplifier 71 can be programmed to impart to the discharge output signal $S_{d-out}$ an offset value and an amplification gain value by means of offset signal $S_{off}$ and a gain signal $S_{ga}$ provided by the control module 73, so producing an amplified output signal $S_{aout}$.

The wide band programmable amplifier 71 allows, as an example, a continuous gain variation ranging from about −5 dB to +40 dB. The analog-to-digital converter 72 is structured to be synchronised by a clock signal CK generated by the control module 73 and generate converted data DTA to be sent to the control module 73. The analog-to-digital converter 72 is, as an example, capable of converting 250 mega-samplers per second with an 8 bit resolution. This sampling frequency allows acquiring the discharge electrical signal $S_{d\text{-}out}$ with a time resolution of 4 ns. It is observed that most partial discharge pulses are usually longer that 0.5 µs.

Particularly, the control module 73 includes a processing unit 74 (PU), such as a microprocessor, a memory 75 (M), such as a RAM (Random Access Memory), and a synchronization logic module 76 (SINL). More particularly, the memory 75 can be a circular buffer. The processing unit 74 is connected to a timing module 87 (TM) which provides a clock signal.

The synchronization logic module 76 is configured to receive the second synchronization signal $S_{syn2}$, extract from it the carried timing information, such as the period and phase of the AC electric voltage, and transfer the information to the processing unit 74.

An input/out port 77 allows transferring output commands Comm generated by the processing unit 74 to the wide band programmable amplifier 71 under the form of the offset signal $S_{off}$ and the gain signal $S_{ga}$.

The control module 73 is also provided with a trigger module 78 (TRLM) and with an address generation module 79 (ADD-GEN) configured to generate the addresses necessary to write new data in the memory 75 and read data stored in the memory 75, under the control of the processing unit 74.

The trigger module 78 is structured to perform the discharge signals acquisition process and is configured to trigger the memorisation of samples of the amplified output signal $S_{aout}$ exiting the wide band programmable amplifier 71 only for samples of the amplified output signal $S_{aout}$ meeting the discrimination criterion.

The control module 73 further comprises a host interface module 80 (INTF) allowing data transferring neurode to a transceiver 81 (TR), for example a USB/Ethernet transceiver, configured to exchange data/commands with the selection processing module 700 by a wired or wireless connection line BD.

The control module 73 can be also provided with an extraction module 83 (e.g. a co-processor CO-P) connected to the processing unit 74. The extraction module 83 is configured to perform extraction, particularly, real-time extraction of pulse features from the data store in the memory 79. Examples of possible pulse features extracted by the co-processor are: peak value and polarity, phase, energy, duration and rough estimation of Weibull parameters.

In accordance with the described first example, the trigger module 78 includes a first neural network module 800; an example of the architecture of the first neural network module 800 is shown in FIG. 5b. The first neural network module 800 is configured to provide a similarity index SI representing a similarity between a reference signal and an input waveform signal. The similarity index SI can selectively assume a first value (e.g. the value 1) representative of a positive similarity result or a second value (e.g. the value 0) representative of a non-similarity result.

The first neural network module 800 of FIG. 5b comprises a plurality of input ports $IP_1$-$IP_N$, at least one hidden layer 801 interconnected with the plurality of input ports $IP_1$-$IP_N$, an output neurode $ON_1$ and an output port $OP_1$ (e.g. a single output port). The particular first neural network module 800 shown in FIG. 5b has the structure of a Multi Layer Perceptron having a single hidden layer 801. The hidden layer 801 comprises a plurality of hidden neurodes $HN_1$-$HN_H$ having inputs connected to the plurality of input ports $IP_1$-$IP_N$ and each having an output connected to the output neurode $ON_1$.

Figure 5:
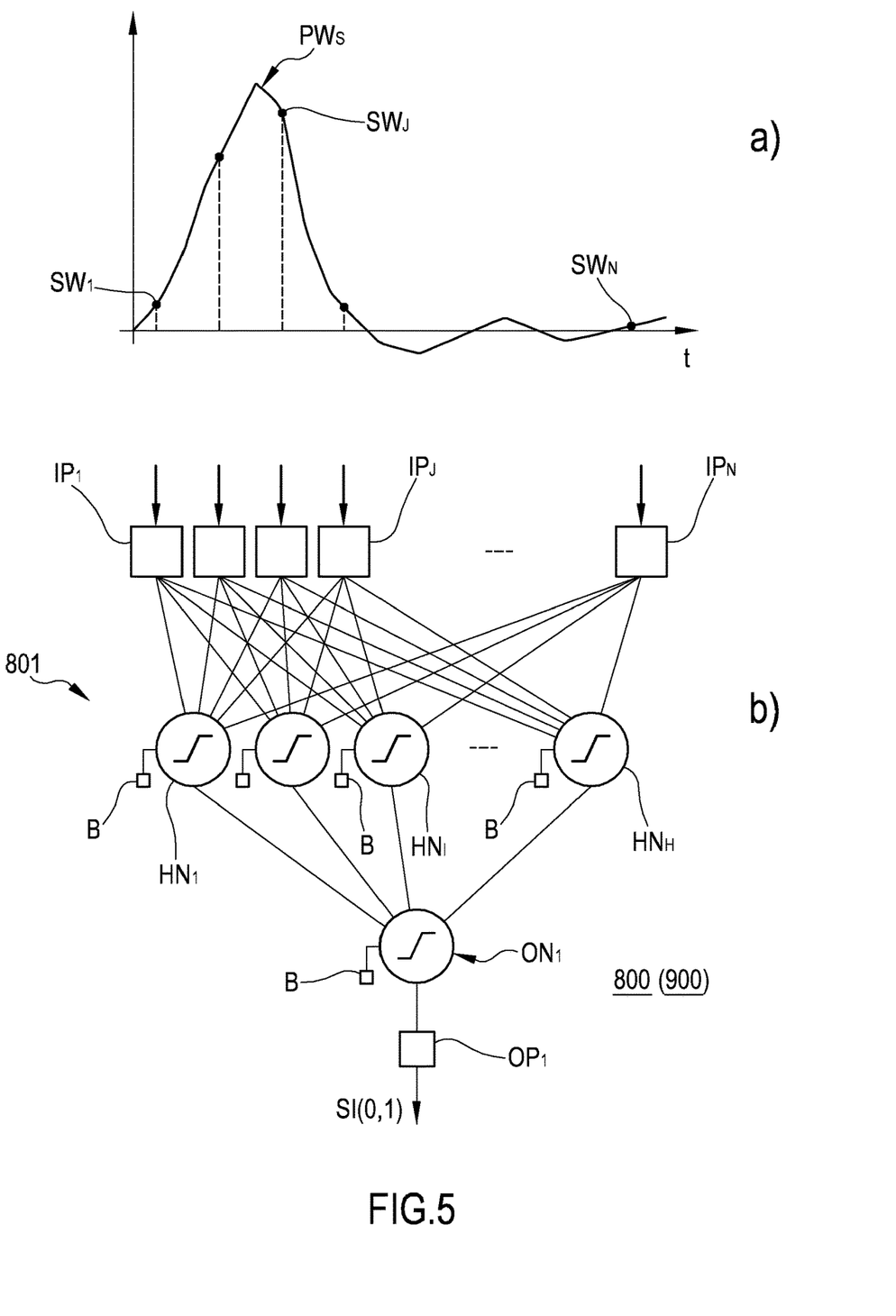

FIG. 5,a) shows an example of a trend of a pulse waveform $PW_s$ included in the amplified output signal $S_{aout}$ received at the analog-to-digital converter 72. The analog-to-digital converter 72 is structured to represent the pulse waveform $PW_s$ by means of samples $SW_1$-$SW_N$. Particularly, the number N of the input ports $IP_1$-$IP_N$ is equal to the number of samples $SW_1$-$SW_N$. Each sample $SW_1$-$SW_N$ is represented by a digital value.

Figure 6:
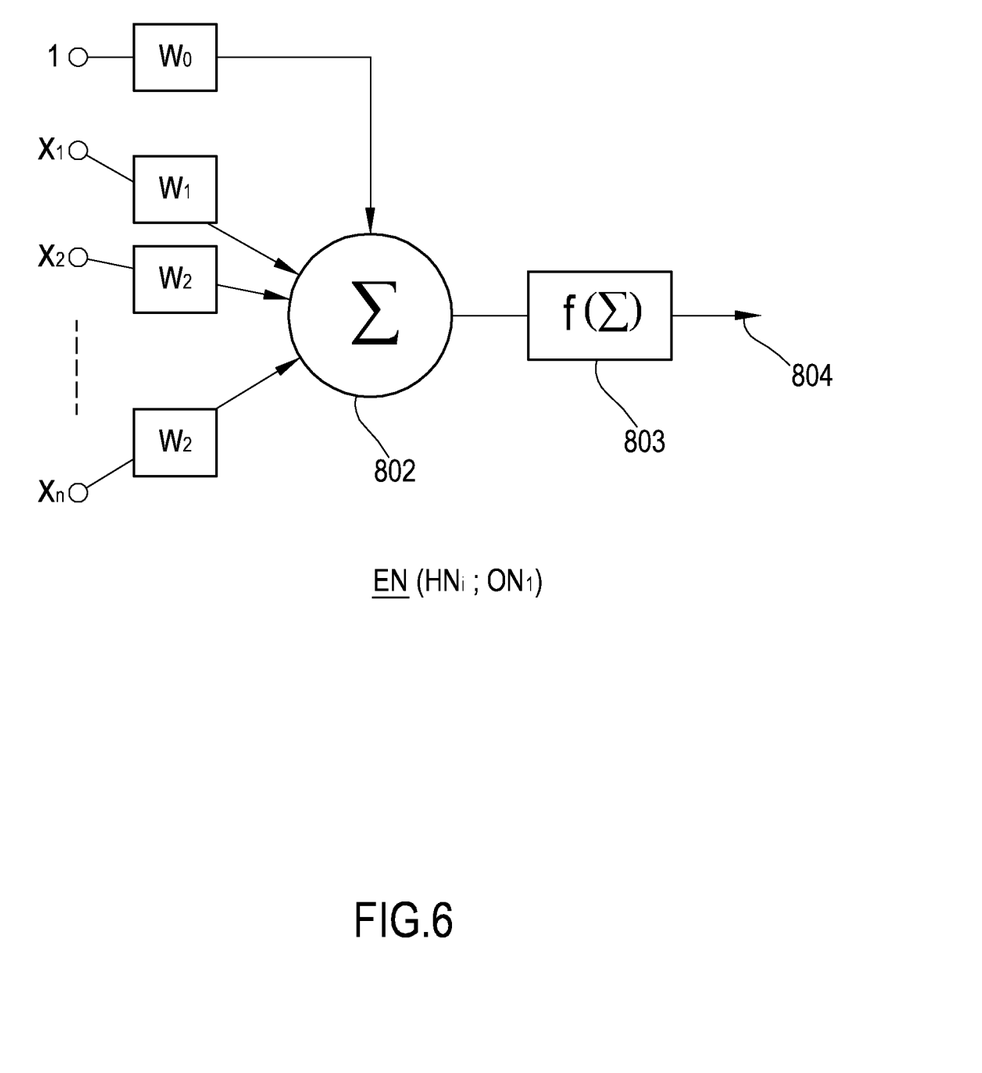
FIG. 6 shows the architecture of an exemplifying neurode employable by said has neural network module.

FIG. 6 shows the architecture of an exemplifying neurode EN which can correspond to one of the neurode $HN_1$-$HN_H$ of the hidden layer 801 or to the output neurode $ON_1$. The architecture of the neurode EN shows a plurality of inputs $X_1$-$Xn$, a bias input B (e.g. fixed to 1), a plurality of weights $W_0$-$W_n$, a sum node 802 ($\Sigma$), an activation function module 803 ($f(\Sigma)$) and an output 804. The neurode EN is configured so that the value of each input $X_i$ is multiplied by a weight $W_i$ and summed together in the sum node 803. The neurode output is computed as a function f of this sum.

The activation function module 803 employed in the neuronal network module 800 can be a non-linear, step-like function as the Sigmoid activation function. Other employable activation functions are: identity function, Tangtoid function, step function, signum function and piecewise linear function. Continuous functions (e.g. sigmoid, tangentoid and piecewise linear, etc.) achieve better results compared to discontinuous functions (such as step, signum, etc.).

In accordance with a first embodiment of the first neural network module 800, each hidden neurode $HN_1$-$HN_H$ of the hidden layer 801 and the output neurode $ON1$ includes a bias input B and employs a piecewise linear activation function. As an example, 4 hidden neurodes $HN_1$-$HN_4$ can be as employed and 256 input ports $IP_1$-$IP_N$ are implemented.

The first neural network module 800 can be trained choosing a reference group of samples to be used as input sample and choosing a target output result of the similarity index SI. During the training step, the input data are applied to the input ports $IP_1$-$IP_N$, a current index at the output port $OP_1$ of the first network module 800 is calculated (proceeding from the inputs to the outputs), and the difference with the target output, i.e. an error, is evaluated.

The weights $W_0$-$W_n$ are then iteratively adjusted in order to minimize the error. Once the error is sufficiently low, the first neural network module 800 is able to provide the correct output for each received input. If the first neural network module 800 is provided with the hidden layer 801, an algorithm called "backpropagation" can be used to performed the training This algorithm adjusts the weights $W_0$-$W_n$, starting from the output result and proceeding toward the input layer, and is quite heavy to implement for big neural networks. If no hidden layers are present, the training algorithms are quite simple and fast (i.e. a Hebb rule, a Delta rule, or other rules). In both cases the training can be done in software and once the resulting values of the weights $W_0$-$W_n$ are available, they are downloaded in the hardware module. This avoids a hardware implementation of the training circuits.

In accordance with a second example (shown in FIG. 7b), the first neural network module 800 is implemented as a perceptron. A perceptron is a neural network having a single neurode so the first neural network module 800 of FIG. 7b is analogous to the first embodiment shown in FIG. 5,b) but it does not comprise any hidden layer: the input ports $IP_1$-$IP_N$ are directed connected to the output neurode $ON_1$. Particularly, the neural network module 800 is a perceptron employing a linear activation function or a piecewise linear activation function. The piecewise linear activation function 803 is, as an example, a step activation function and the weights $W_0$-$W_n$ are one bit coefficients. It is observed that a perceptron having a linear activation function is a particular example of an ADALINE network (ADAptive LInear NEuron). An ADALINE network is a single layer neural network.

The trigger module 78 is preferable implemented by the first neural network module 800 of the second example (as shown in FIG. 7*b*). In particular, the first neural network module 800 of the trigger module 78 is implemented in hardware and the weights are implemented in hardware as fixed coefficients $W_0$-$W_n$. The training process of the second example shown in FIG. 7*b* is easier than the one of the first example shown in FIG. 6*b* and requires less memory capacity. For instance, each sample $SW_s$ of a pulse waveform $PW_s$ can be represented by an integer number from 1 to 8 bit. Particularly, a Hebb rule or a Delta rule can be used to perform the training process.

This allows a great reduction of computational requirements and memory for storing weights. When used for triggering purposes, the preferred example brings a substantial advantage compared to the full MLP. Since the ANN has to be implemented in hardware by means of logic circuits in order to handle the high sampling rate commonly used in these applications (100 to 200 MHz), the availability of a simplified circuit is essential.

Referring now the selection and processing module 700 (FIGS. 1 and 4), it comprises the following modules/devices: a transceiver 701 (TR) to exchange data/commands with the acquisition and analysis device 300, a further processing unit 702 (PU), memory modules 703 (M), a display and interface device 704 (DYS), such as a keyboard and/or a touch screen. Moreover, the selection and processing module 700 comprises at least a second neural network module 900 which is, particularly, configured to implement: discharge signals noise filtering, and/or discharge signals classification.

The selection and processing module 700 also allows receiving the plurality of digital samples DS together with the timing information received from the acquisition and analysis device 300 and produce a phase resolved pattern in which any digital samples DS is associated with a phase suitably synchronized with the supply electromagnetic signal $S_{sup}$. As an example, the processing module 700 allows displaying this phase resolved pattern in which the maximum amplitude of each pulse is plotted versus the corresponding phase value, and/or the samples of the pulse waveforms are displayed versus time.

Figure 7:
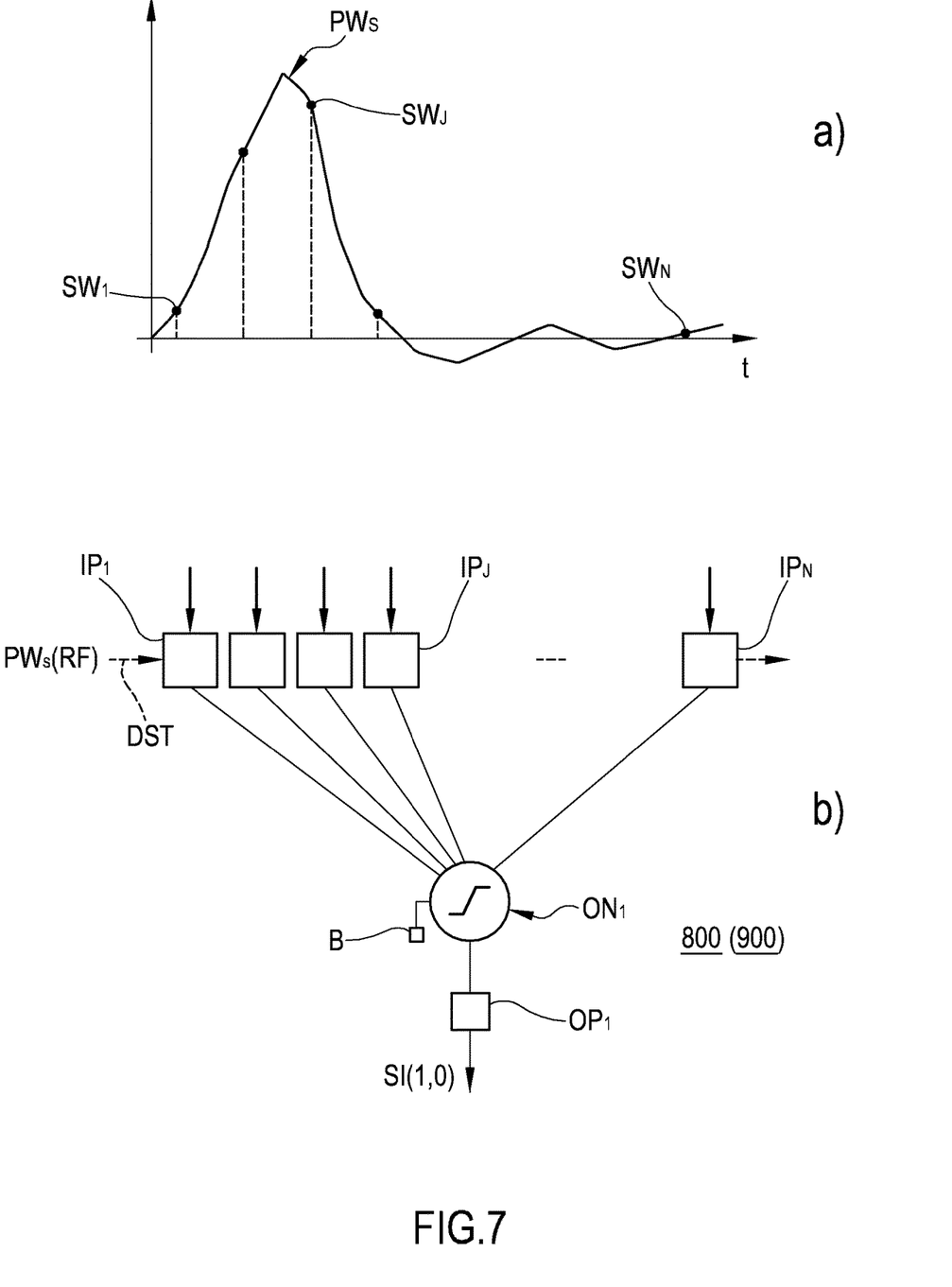

In accordance with an example, the second neural network module 900 can be identical or analogous the first second neural network module 800 described with reference to FIGS. 6, 7 and 8. Particularly, the discharge signals noise filtering and the discharge signals classification can be implemented by two respective neural network modules, each analogous to the second neural network module 900, or the second neural network module 900 can be used both for implementing the discharge signals noise filtering and the discharge signals classification. Preferably, the second neural network module 900 is a software module and particularly is analogous to the first neural network module 800 shown in FIG. 5*b* and comprising a hidden layer 801. As an example, for the noise filtering and the discharge signals classification, each sample $SW_i$ of a pulse waveform PWs can be represented by an integer number from 1 to 8 bit and the coefficients $W_0$-$W_n$ can have a fixed point number representation (e.g. 16 bit representation) or floating-point number representation (e.g. 32 bit representation).

Figure 8:
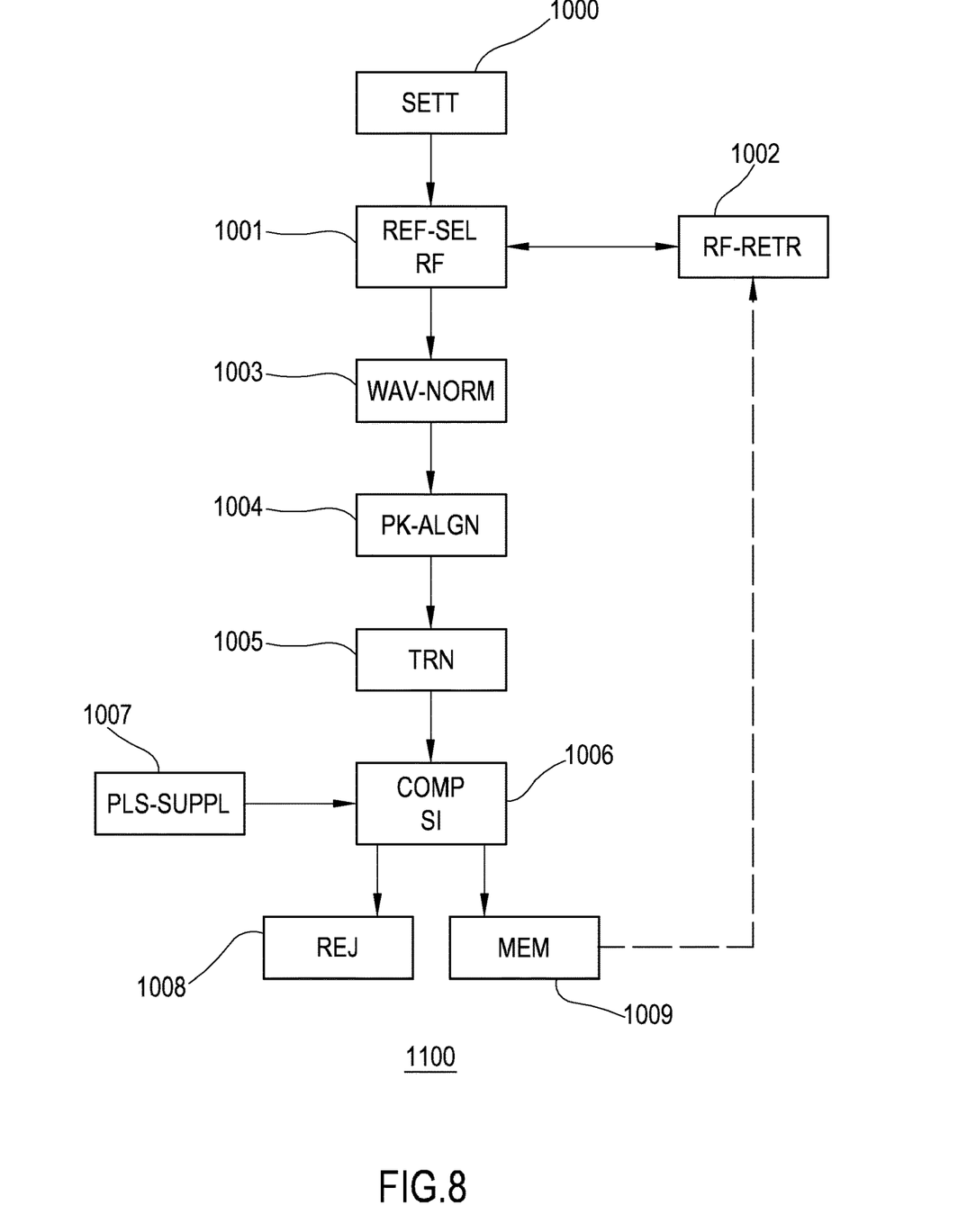
FIG. 8 shows an embodiment of a flow chart illustrating an example of a processing method employable by said partial discharge acquisition system.

FIG. 8 shows a flow chart illustrating an example of processing method 1100 employable by the first neural network module 800 or by the second neural network module 900 in implementing one of the discrimination criteria listed above. The processing method 1100 comprises a setting step 1000 in which a first discrimination criterion among the following criteria is set: discharge signals acquisition, discharge signals noise filtering, discharge signals classification. The setting step 1000 may be performed by a corresponding setting module, such as a software module, included into the acquisition and analysis device 300 and/or in the selection processing module 700. The processing method 1100 further includes a reference selection step 1001 (REF-SEL) in which at least one reference pulse RF is chosen according to the specific discrimination criterion to be implemented. Particularly, a set of reference pulses RF is selected. The reference pulses RF can be manually selected by the user employing a corresponding reference selection module, such as a software component, included in the acquisition and analysis device 300 and/or in the selection processing module 700.

This set of reference pulses RF can be specifically designed (synthesized) as will be further described with reference to the operating of the trigger module 78. With reference to the noise filtering discrimination or the classification criteria, the set of reference pulses RF can be chosen among a phase resolved pattern, i.e. a plurality of pulse waveforms, stored in the memory 703 of the selection processing module 700, as represented in FIG. 8 by a retrieving step 1002 (RF-RETR). Each reference pulses RF can be one of the already acquired group of digital samples DS corresponding to a pulse waveform showing some specific proprieties, such as the position in the phase resolved pattern, specific range of some pulse feature value, time stamp or other parameters. Particularly, the reference pulses RF can be the pulses located in a specific area of the phase resolved pattern having a short vectorial distance from a point in the phase resolved pattern pointed by the user. This approach can produce satisfying results since usually pulses found in the same region of the phase resolved pattern are originated by the same physical phenomenon and so have a similar shape. It has to be noted that the selection of reference pulses RF among similar pulses is not particularly critical since the similarity relation is transitive.

Preferably, the processing method 1000 includes a waveform normalization step 1003 (WAV-NORM) and a peak alignment step 1004 (PK-ALGN). In the waveform normalization step 1003 each sample of each pulse waveform $PW_s$ is divided by the waveform absolute maximum. The peak alignment step 1004 is performed by shifting the waveform samples back or forth along the input ports $IP_1$-$IP_N$ so as each peak sample of each pulse waveform is supplied to a selected input port of the plurality of input ports $IP_1$-$IP_N$ in order to align the position of the maximum values of all the processed pulse waveforms. The waveform normalization step 1003 (WAV-NORM) and a peak alignment step 1004 (PK-ALGN) can be implemented by corresponding computing modules, such as software components, running under the control of the processing unit 74 and/or the further processing unit 702.

The waveform normalization step 1003 and the peak alignment step 1004 allows eliminating two unessential difference in waveforms, due to scale and time shift, so requiring a less complex architecture of the first neural network module 800 and the second neural network module 900 to perform the processing.

The processing method 1100 includes a training step 1005 (TRN) in which the first neural network module 800 or the second neural network module 900 is trained employing training input data corresponding to the selected set of reference pulses RF and a set of counter-example waveforms. A counter-example waveform can be a pulse waveform specifically designed (synthesized) or can be one of the already acquired group of digital samples DS corresponding to a pulse waveform located outside the area of the phase resolved pattern chosen by the user to select the set of reference pulses RF. The training step 1005 is performed by supplying training input data on the input ports $IP_1$-$IP_N$, computing the results at the output port $OP_1$ and computing errors with respect to the target values of the similarity index SI. The weights $W_0$-$W_n$, are then iteratively adjusted in order to minimize the error. In the training step 1005 when one of reference pulses RF is employed as training input data the target value is set to 1, when one of the counter-examples is used as training input data the target value is set to 0. The training step 1005 can be managed by a training module, such as a software component provided in the acquisition and analysis device 300 and/or in the selection processing module 700. It is observed that when the first neural network module 800 or the second neural network module 900 is implemented by a perceptron (FIG. 7b) and a single reference pulse RF is employed, the training step 1005 can be carried out by choosing each weight $W_0$-$W_n$ equal to a value of the group of samples corresponding to the employed reference pulse RF. It is also noticed that in this case the perceptron of FIG. 7b operates performing a cross-correlation comparison. The training step 1005 is carried out using samples resulting from the waveform normalization step 1003 and the peak alignment step 1004.

In a computing step 1006 (COMP) the first neural network module 800 or the second neural network module 900 is fed, in a supplying step 1007 (PLS-SUPPL), with a plurality of digital samples corresponding to a pulse waveform to be processed. With reference to the acquisition criterion, the pulse waveform is included in the amplified out signal $S_{aout}$. If the noise filtering process is performed, the pulse waveforms are the digital samples DS acquired by the trigger module 78 and sent to the processing module 700. In carrying out the classification process, the pulse waveforms supplied to the input ports $IP_1$-$IP_N$ are the samples corresponding to the pulse waveforms selected in applying the noise filtering process. The computing step 1006 is carried out using samples which have been processed according to the waveform normalization step 1003 and the peak alignment step 1004.

On the basis of the values of the similarity indexes SI obtained by the first neural network module 800 or the second neural network module 900 the pulse waveforms can be rejected (rejection step 1008, REJ) or can be selected and memorised (memorization step 1009, MEM). However, the rejected pulse waveforms can be memorized in order to perform further analysis. If the processing method 1100 implements the discharge signals acquisition criterion or the noise filtering criterion, the pulse waveforms selected in the memorization step 1009 can be stored in the memory 703.

An example of the operation of the partial discharge acquisition system 500 implementing a particular embodiment of the processing method 1100 is described herein below.

In operation (FIG. 1), the antenna 1 picks up discharge signals $S_d$, noise signals $S_n$ and supply electromagnetic signal $S_{sup}$ and generates the received electrical signal $S_{in1}$. The received electrical signal $S_{in1}$ is filtered by the discharge processing module 600 so reducing the components external to the frequency range 0.1 MHz to 100 MHz and producing the output discharge signal $S_{d\text{-}out}$ to be fed to the acquisition and analysis device 300. The received electrical signal $S_{in1}$ or a signal picked up by the synchronization sensor 13 is transferred to the second input terminal 11 to form the first synchronization electrical signal $S_{syn1}$ which enters the synchronization processing module 200. The synchronization processing module 200 amplifies and filters the first synchronization electrical signal $S_{syn1}$ so producing the second synchronization electrical signal $S_{syn2}$ which is supplied to the acquisition and analysis device 300.

With reference to the operation of the acquisition and analysis device 300, the control module 73 performs a configuration step and an acquisition step. In the configuration step acquisition parameters are established, such as the gain of the wide band programmable amplifier 71, and the training and initialization of the first network module 800 of the trigger logic module 78. The training of the trigger logic module 78 is performed by considering at first a synthetic archetypal pulse (i.e. a pulse shape specifically designed and featuring all the desired characteristics) as reference pulse. This synthetic archetypal pulse can be subsequently substituted by one or more reference pulses RF chosen among a plurality of already acquired discharge signals.

In the acquisition step the processing unit 74, the trigger logic module 78 and the address generation module 79 manage the storing in the memory 75 of the data corresponding to the amplified output signal $S_{aout}$. When the trigger module 78 implementing the processing method 110 detects, by means of the neural network module 800, a similarity index SI at the output port $OP_1$ indicating that a particular pulse waveform meets the acquisition criterion, the corresponding waveform pulse is acquired under the form of a plurality of digital samples DS (i.e. stored in the memory 75) and the acquisition of further data is stopped. It is observed that the amplified output signal $S_{aout}$ entering the trigger logic module 78 can be a continuous sample stream instead of a fixed set of samples. In this case, as represented in FIG. 7b by an arrow DST, the amplified output signal $S_{aout}$ is supplied to the first neural network module 800 by shifting each sample though the input ports $OP_1$-$OP_N$, like in a shift register: when a valid pulse $PW_s$ is in the correct position, the similarity output port $OP_1$ produces a similarity index having the value 1, so signalling a trigger.

The processing unit 74 collects the timing information from the synchronization logic module 76 and the timing module 87 and sends the plurality of digital samples DS stored in the memory 75 together with the corresponding timing information to the selection processing module 700.

The selection processing module 700 receives the plurality of digital samples DS and the timing information and, by means of the second neural network module 900, performs a discharge signals noise filtering of the plurality of digital data DS by implementing the processing method 1100. In order to perform the discharge signals noise filtering the second neural network module 900 has been previously trained with a corresponding group of reference samples representing a reference partial discharge pulse waveform. The second neural network module 900 produces a similarity index SI assuming values 1 or 0 so indicating if a particular pulse can be considered a partial discharge pulse or it has to be considered a noise pulse, respectively. The selection processing module 700 stores or displays the plurality of filtered digital samples showing a positive similarity index as result of the discrimination criteria based on discharge signals noise filtering implemented by the second neural network module 900.

The second neural network module 900, or another neural network module, is used to implement the discrimination criteria concerning the discharge signals classification by applying the processing method 1100. In order to perform the discharge signals classification the second neural network module 900 is previously trained with another group of reference samples representing another reference partial discharge pulse waveform belonging to a predetermined class. The second neural network module 900 produces a similarity index assuming values 1 or 0 so indicating if a particular pulse can be considered as belonging to the predetermined class or it has to be considered not included in that class, respectively. The same second neural network module 900 can be used to group pulses belonging to another class or sub-class.

As clear for the above description, the partial discharge signal processing method 1100, using a neural network module trained to compute a similarity index, can be employed for diverse discrimination criteria (such as: pulse acquisition, pulse noise filtering and pulse classification) by changing the reference pulse employed in the training step. This flexibility of the described method is achieved with a non-complex structure showing computational difficulty compatible with both portable and non-portable detecting apparatuses so allowing the use of the described partial discharge acquisition system in different environments.

The invention claimed is:

1. A partial discharge signals processing method comprising:
   setting a first discrimination criterion from the following criteria:
   acquisition, noise filtering, and classification of partial discharge signals;
   detecting a plurality of pulse waveforms associated with partial discharge waveform signals produced by an electrical object;
   defining at least one first reference pulse waveform in accordance with the first criterion;
   providing a neural network module having a single output port configured to provide a similarity index;
   performing a first training of the neural network module based on said at least a first reference pulse waveform to produce the similarity index selectively assuming a first value and a second value representative of a similarity/non similarity of an input pulse waveform with the at least a first reference pulse waveform, respectively;
   comparing said plurality of pulse waveforms with the at least a first reference pulse waveform by means of the neural network module to obtain first similarity index results at the single output port; and
   memorizing/rejecting each compared pulse waveform on the basis of the obtained first similarity index results to satisfy the first discrimination criterion.

2. The processing method of claim 1, further comprising:
   setting a second discrimination criterion different from the first criterion;
   selecting at least a second reference pulse waveform in accordance with the second criterion;
   performing a second training of said neural network module to produce the similarity index selectively assuming the first value and the second value representative of a similarity/non similarity of a further input pulse waveform with the at least a second reference pulse waveform, respectively;
   comparing at least part of said plurality of pulse waveforms with the at least a second reference pulse waveform by means of the neural network module to obtain second similarity index results; and
   memorizing/rejecting each compared pulse waveform resulting on a basis of the obtained second similarity index results and on the second discrimination criterion.

3. The processing method of claim 2, wherein said first and second discrimination criteria are discharge signals noise filtering and the discharge signals classification.

4. The processing method of claim 1, wherein the neural network module is configured to implement an activation function in the group comprising: a non-linear function, a step-like function, a Sigmoid function, an identity function, a Tangtoid function, a step function, a signum function, and a piecewise linear function.

5. The processing method of claim 1, wherein the neural network module comprises:
   a plurality of input ports, each input port being configured to receive a digital sample associated with a pulse of said plurality of pulse waveforms;
   at least one neurode having associated a plurality of weights; and
   wherein the single output port configured to provide the similarity index is connected to a neurode which is an output neurode.

6. The processing method of claim 5, wherein said neural network module has a structure of a multi layer perceptron and comprises a hidden layer provided with a plurality of hidden neurodes having inputs connected to the plurality of input ports.

7. The processing method of claim 6, wherein said neural network module comprises a single hidden layer having outputs connected to the output neurode.

8. The processing method of claim 6, wherein the first discrimination criterion is one of the following: discharge signals noise filtering, or discharge signals classification.

9. The processing method of claim 8, wherein said neural network module comprising a single hidden layer is a software module.

10. The processing method of claim 5, wherein the neural network module has a structure of a perceptron and comprises a single neurode connected between the input ports and the output port.

11. The processing method of claim 10, wherein said perceptron is used to implement said discharge signals acquisition criterion.

12. The processing method of claim 11, wherein said neural network module is a hardware module.

13. The processing method of claim 5, wherein performing the first training comprises:
   calculating a plurality of weights values of said plurality of weights by supplying the neural network module with counter-examples for which said second value representative of a non-similarity result is requested.

14. The processing method of claim 5, wherein comparing by means of the neural network module comprises:
   defining a plurality of group of samples, each group of samples representing a pulse waveform of said plurality of pulse waveforms;
   supplying each group of samples to the plurality of input ports; and
   obtaining a similarity index value for each group of samples.

15. The processing method of claim 14, wherein, before supplying each group of samples to the plurality of input ports, further comprising:

performing a waveform normalization In which each sample of the group of samples is divided by a waveform absolute maximum value; and performing a peak alignment so as each peak sample of each group of samples is supplied to a selected input port of the plurality of input ports.

16. The processing method of claim 1, wherein defining the at least first reference pulse waveform comprises:

synthetizing the at least first reference pulse waveform in accordance with the first criterion.

17. The processing method of claim 1, wherein defining the first reference pulse waveform comprises:

selecting the at least a first reference pulse waveform from said plurality of pulse waveforms.

18. The processing method of claim 1, further comprising:

detecting said partial discharge waveform signals associated with partial discharges of an electric component;

detecting a synchronization electromagnetic signal generated by an alternate current electrical voltage associated with operation of an electrical object; and synchronizing said partial discharge waveform signals to said synchronization electromagnetic signal.

19. A partial discharge signals processing system comprising:

a detecting device structured to detect a plurality of pulse waveforms associated with detected partial discharge waveform signals produced by an electrical object;

a processing module connected to the detecting device and comprising:

a neural network module comprising:

an input module for receiving an input pulse waveform of said plurality of pulse waveforms;

a comparison module connected to the input module and structured to compare a reference pulse waveform with the input pulse waveform; and a single output port connected to the comparison module and structured to provide a similarity index selectively assuming a first value or a second value of a similarity/non similarity of the input pulse waveform with the reference pulse waveform, respectively, representative of the nature of a detected pulse waveform, wherein said processing module comprises:

a setting module structured to set a discrimination criterion selected from the following: discharge signals acquisition, discharge signals noise filtering, discharge signals classification; and a reference selection module connected to the setting module and structured to select the reference pulse waveform in accordance with the selected discrimination criterion.

* * * * *